United States Patent
Teo et al.

(10) Patent No.: US 10,892,728 B2
(45) Date of Patent: Jan. 12, 2021

(54) VIRTUAL INDUCTORS USING FERROELECTRIC CAPACITANCE AND THE FABRICATION METHOD THEREOF

(71) Applicant: Mitsubishi Electric Research Laboratories, Inc., Cambridge, MA (US)

(72) Inventors: Koon Hoo Teo, Lexington, MA (US); Pin Chun Shen, Cambridge, MA (US); Chungwei Lin, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 62 days.

(21) Appl. No.: 16/226,747

(22) Filed: Dec. 20, 2018

(65) Prior Publication Data

US 2020/0204139 A1    Jun. 25, 2020

(51) Int. Cl.
*H03H 1/00*     (2006.01)
*H03H 3/00*     (2006.01)
*H03H 7/06*     (2006.01)
*H03H 1/02*     (2006.01)

(52) U.S. Cl.
CPC ............... *H03H 1/02* (2013.01); *H03H 3/00* (2013.01); *H03H 7/06* (2013.01); *H03H 2001/0085* (2013.01)

(58) Field of Classification Search
CPC ............... H03H 1/02; H03H 3/00; H03H 7/06
USPC .......................................................... 333/172
See application file for complete search history.

(56) References Cited

U.S. PATENT DOCUMENTS

| 2011/0310651 A1* | 12/2011 | Evans, Jr. ............... G11C 11/22 365/145 |
| 2015/0318285 A1* | 11/2015 | Zhang ............... H01L 27/10805 257/295 |

\* cited by examiner

*Primary Examiner* — Rakesh B Patel
(74) *Attorney, Agent, or Firm* — Gennadiy Vinokur; James McAleenan; Hironori Tsukamoto

(57) ABSTRACT

Devices, system and methods a circuit, including a resistor, a normal capacitor and a ferroelectric capacitor connected in series. An input terminal to provide an input voltage across the circuit. An output terminal to deliver an output voltage taken across the normal capacitor. The circuit comprises a ferroelectric layer sandwiched between a first buffer layer and a second buffer layer. The first buffer layer contacts a portion of a first metal layer and first metal layer extends beyond the first buffer layer. A dielectric layer sandwiched between a second metal layer and a third metal layer. Such that the second metal layer extends beyond the dielectric layer and in contact with the second buffer layer. Wherein the ferroelectric capacitor is formed by the first metal layer. The ferroelectric layer sandwiched between the first buffer layer and the second buffer layer, and the second metal layer.

15 Claims, 12 Drawing Sheets

VIRTUAL INDUCTORS USING FERROELECTRIC CAPACITANCE AND THE FABRICATION METHOD THEREOF

FIELD

The present invention relates generally to signal processing, and more particularly an integrated circuit that selectively controls a resonance frequency of a signal based on one or more dimension of at least one material in the integrated circuit.

BACKGROUND

Conventional silicon-based metal-oxide semiconductor field-effect transistors (MOSFETs) suffer from many issues including power and device dimension scaling, which are some factors that prevent their advancement and growth in this technological realm. Some effects of these limitations include a supply voltage limited by subthreshold swing (SS), which is a gate voltage change ($\Delta V_{gs}$) required to increase a source-drain current ($I_{ds}$) by one decade, among other effects.

Other disadvantages employing conventional real physical inductors in systems include their large physical size, high manufacturing costs, along with their heavy weight, to name a few disadvantages. However, inductors are intensively needed in many advanced applications in today's technologies. For example, inductors are combined with capacitors and resistors to create matching circuits and filters for analog circuits and signal processing. In addition, inductors are used to build transformers by combining those inductors that have a shared magnetic path. Other applications like motors, where the inductors turn the electrical energy into mechanical energy, and energy storage devices, store the energy in the form of a magnetic field.

In regard to impedance matching circuits for analog circuits and signal processing, it is important to have circuits capable of matching two circuits of different impedance for maximum power transfer of signal.

In regards to filters, a common need for circuits capable of removing some unwanted frequency components or features from a signal is in high-performance stereo systems, where certain ranges of audio frequencies need to be amplified or suppressed for best sound quality and power efficiency. Equalizers, for example, allow the amplitudes of several frequency ranges to be adjusted to suit the listener's taste and acoustic properties of the listening area. In contrast, crossover networks block certain ranges of frequencies from reaching speakers. Both equalizers and crossover networks are examples of removing unwanted components or features from the signal, which are designed to accomplish reaching certain frequencies.

Another practical application of such circuits is in the "conditioning" of non-sinusoidal voltage waveforms in power circuits. Some electronic devices are sensitive to the presence of harmonics in the power supply voltage, and so require power conditioning for proper operation.

Frequency-selective or circuits capable of removing some unwanted components or features, pass to the output only those input signals that are in a desired range of frequencies (called pass band). The amplitude of signals outside this range of frequencies (called stop band) is reduced (ideally reduced to zero). Typically, in these circuits, the input and output currents are kept to a small value and as such, the current transfer function is a less important parameter than the voltage transfer function in the frequency domain.

For example, conventional $1^{st}$ order passive low pass filters include a resistor and a normal capacitor connected in series, so that they carry the same current. An input terminal is connected across the whole circuit, whereas the output terminal is connected across the normal capacitor. The conventional $1^{st}$ order passive low pass filter is simple in implementation, but does not provide a gain greater than 0 dB and/or a rapid power roll off with a value more than 20 dB/decade around and beyond a cutoff frequency.

Some aspects of a Gain vs Frequency curve for the conventional $1^{st}$ order passive low pass filter, includes the Gain defined as 20 log(H(f)) wherein $H(f)=V_{out}(f)/V_{in}(f)$. The value of Gain for a passive filter in the pass band is either 0 dB or slightly less than that. A cut off frequency is defined such that the gain at that point is −3 dB. The power roll off, i.e., the slope of the Gain curve in the stop band beyond cutoff frequency, is −20 dB/decade. The conventional $1^{st}$ order low pass filter cannot provide a gain greater than 0 dB and a power roll off with a value more than −20 dB/decade around and beyond a cutoff frequency. In order to achieve higher power roll off in a passive low pass filter, two such low pass filters must be cascaded to make it a second order low pass filter. Also, in order to have a gain higher than 0 dB an active filter is needed with active elements like transistors, operational amplifiers.

An RLC circuit is an electrical circuit consisting of a resistor (R), an inductor (L), and a capacitor (C), connected in series or in parallel. The name of the circuit is derived from the letters that are used to denote the constituent components of this circuit, where the sequence of the components may vary from RLC. The circuit forms a harmonic oscillator for current, and resonates in a similar way as an LC circuit. Note, an LC circuit, also called a resonant circuit, that is an electric circuit consisting of an inductor, represented by the letter L, and a capacitor, represented by the letter C, connected together. LC circuits are used either for generating signals at a particular frequency, or picking out a signal at a particular frequency from a more complex signal; this function is called a bandpass filter or also could be a resonant circuit. The components of the LC circuit are used in many electronic devices, particularly radio equipment, used in circuits such as oscillators, filters, tuners and frequency mixers. For a circuit model incorporating resistance, this is called an RLC circuit.

Introducing the resistor increases the decay of these oscillations, which is also known as damping. The resistor also reduces the peak resonant frequency. Some resistance is unavoidable in real circuits even if a resistor is not specifically included as a component. An ideal, pure LC circuit exists only in the domain of superconductivity.

The RLC circuits do not depend upon an external power supply and/or they do not contain active components such as transistors, i.e. thus, the RLC circuits are passive. The RLC circuits can be configured to form a resonant circuit providing a high gain for a particular band of frequencies.

Inductors block high-frequency signals and conduct low-frequency signals, while capacitors do the reverse. A filter in which the signal passes through an inductor, or in which a capacitor provides a path to ground, presents less attenuation to low-frequency signals than high-frequency signals and is therefore a low-pass filter. If the signal passes through a capacitor, or has a path to ground through an inductor, then the filter presents less attenuation to high-frequency signals than low-frequency signals and therefore is a high-pass filter. Resistors on their own have no frequency-selective properties, but are added to inductors and capacitors to determine the time-constants of the circuit, and therefore the frequencies to which it responds.

The RLC circuits can provide better power roll off than the 1$^{st}$ order passive filter. However, inductors are very bulky in physical size due to their need to store energy in a form of current. To that end, fabricating/realizing an inductor in an integrated circuit (IC) is very difficult and consumes a lot of die area, dimensional space. In addition, the RLC circuits also do not provide gain greater than 0 dB.

There is a pressing need to develop a compact and efficient circuit that can provide Gain in the pass band and higher roll of frequency without using any active elements, such as transistors and operational amplifier.

SUMMARY

Some embodiments relate generally to signal processing, and more particularly to an integrated circuit that selectively controls a resonance frequency of a signal based on one or more dimension of at least one material in the integrated circuit.

At least one realization of the present disclosure obtained from experimentation is that some ferroelectric capacitor structures can be designed to have properties that are inductor-free as well as have an active-device-free voltage amplifier. For example, these ferroelectric capacitor structures and designs when implemented into, by non-limiting example, CMOS systems, magnetic energy storage devices, and inductor motor in vehicles, reduce the overall dimensions and weights of the CMOS systems, magnetic energy storage devices and inductor motors in vehicles, when compared to the conventional overall dimensions and weights of conventional CMOS systems, conventional magnetic energy storage devices, and conventional inductor motors in vehicles.

At least one reason for the overall reduction in dimensions and weight, is based on some structural configurations of ferroelectric capacitor that use ferroelectric materials, that result in exhibiting fabricated properties of virtual inductors. Only through extensive experimentation, with many different types of materials, different amounts of the different types of materials, different combinations of different types and amounts of materials, different structural configurations of different types and amounts of materials, that eventually resulted in discovering fabricated structures that can exhibited these unique virtual inductor properties.

Another realization included that by connecting a dielectric capacitor to the ferroelectric capacitor with ferroelectric materials having virtual inductor properties, the whole system, i.e. circuit or integrated circuit, resulted in a voltage gain as well as exhibited resonance behavior at a certain range of frequency. Whereas, in contrast, conventional capacitors composed of a dielectric material sandwiched by two electrodes used in conventional circuits have a two-terminal device, and when connected to a circuit do not provide a voltage gain and resonance behavior to the circuit.

Conventional inductors consist of an insulated wire wound into a coil around a core, which is very bulky or requires a lot of space as a component of a circuit. However, when the conventional inductors were replaced with the devices, systems and methods of the present disclosure (i.e. some structural configurations of ferroelectric capacitor using ferroelectric materials exhibiting unique fabricated virtual inductors properties), and placed into a circuit, revealed that without the very bulky conventional component in the circuit, there was left a large empty space in the circuit. Further, the new circuit with the new device of the present disclosure, weighed less than the conventional circuit with the conventional inductor. In other words, from experimentation it was discovered conventional inductors required a larger space in the circuit, when replaced by the ferroelectric capacitor of the present disclosure. Based on this discovery that a circuit with the present disclosure's ferroelectric capacitor can be smaller, as well as weigh less than the weight of a conventional circuit having an inductor, such a discovery when implemented today's existing conventional products in the electronic technological industries, will result in disrupting today's integrated circuit technology realm, and provide a gateway of opportunities for new products to be smaller and weigh less with the device of the present disclosure, when compared to today's existing conventional electronic products.

Based on aspects of elementary electromagnetic theory, any circuit has an amount of intrinsic inductance due to the electromagnetic interaction between different parts of the circuit. This intrinsic inductance is sometimes referred to as the "parasitic inductance" because this existence is not by design. Based on the same theory, an amount of conventional inductance is generated by winding a wire into a coil as this winding configuration maximizes the electromagnetic interaction between different parts of the wire. The observed inductance in the present disclosure is at least one million times larger than the estimation using the elementary electromagnetic theory.

During experimentation, several aspects of the experimentation included an inductance that originate from a lattice vibration, which had a value based on $$L = \frac{m}{Ne^2} \frac{\text{sample thickness}}{\text{sample area}}$$

where m was the mass of atoms, N was the dipole density, and e was an electron charge. When applying this formula, the resulting inductance was smaller than $10^{-14}$ Henry, which is at least one million times smaller than an observed value tested in the present disclosure. In view of this consideration, again, indicates that the observed inductance behavior may be a different physical origin. Therefore, the "virtual inductor" observed in the present disclosure is not expected from any known teaching of prior arts.

According to some embodiments, the ferroelectric capacitor of the present disclosure can be inserted in a circuit having a resistor, a normal capacitor, wherein the normal capacitor is connected in series with the ferroelectric capacitor. Further, an input terminal provides an input voltage across the circuit. An output terminal delivers an output voltage taken across the normal capacitor, wherein the circuit is an integrated circuit formed on a substrate. The integrated circuit includes a ferroelectric layer sandwiched between a first buffer layer and a second buffer layer. The material properties of the first and second buffer layers can be metallic such as a titanium nitride (TiN) or indium tin oxide (ITO) type material. Further, the first buffer layer can contact a portion of a surface of a first metal layer, such that the first metal layer extends beyond the first buffer layer. Wherein, the second buffer layer contacts a surface of a second metal layer, wherein the second metal layer does not extend beyond the second buffer layer. It is contemplated other configurations regarding the first buffer layer to the first metal layer, the second buffer layer to the second metal layer, or both, can be configured differently depending upon the specific application(s). For example, some micro-scale patterns can be introduced to the ferroelectric and dielectric layers to increase their surface areas and consequently their respective capacitances.

Some aspects of some embodiments of the present disclosure include some structural configurations of ferroelectric capacitor using ferroelectric materials to have specific design parameters that, by non-limiting example, can include, (1) where the resonance frequency and voltage gain can be tunable by controlling a ratio of the normal capacitance to the ferroelectric capacitance, including the thicknesses and areas of those capacitors. Generally, the resonance frequency can be expressed as:

$$\text{Resonant frequency} \sim \sqrt{\frac{1}{LC}} = \sqrt{\frac{1}{L_{ferroelectric}C_{dielectric}}} \sqrt{\frac{A_{dielectric}}{A_{ferroelectric}}}$$

where $L_{ferroelectric}$ and $A_{ferroelectric}$ are the inductance and area of the ferroelectric inductor, and $C_{dielectric}$ and $A_{dielectric}$ is the capacitance and area of the dielectric capacitor, respectively. (2) Another design parameter of some embodiment of the present disclosure can include that the inductance in the device or the system can be tuned by adjusting the thickness or the capacitance of the ferroelectric. (3) Another design parameter can include that ohmic contacts for the device terminals can be favorable to obtain a higher gain. A high contact resistance in the system would decrease in the gain. (4) Another design parameter can include that buffer layers with reasonable conductivities such as TiN or ITO can be helpful to reduce leakage current induced by atom migration or ion diffusion from the metal electrodes during manufacturing processes.

At least one other structure of the ferroelectric capacitor can be composed of more than two types of ferroelectric materials through layer-by-layer depositions. In other words, the more than two types of ferroelectric materials can be combined (layer-by-layer). Wherein the conductive buffer layers can be TiN and ITO that are inserted between the deposited ferroelectric layers of the more than two types of ferroelectric material.

The buffer layer has to have a compatible lattice structure to the ferroelectric material, so that the interface still preserves the bulk lattice structure. In other words, the interface quality, typically characterized by the concentration of defects near the interface, is crucial for the ferroelectricity.

Another structure of the ferroelectric capacitor of the present disclosure, can include ferroelectric material used simultaneously as an inductor and a capacitor. Specifically, the ferroelectric capacitor can be composed of more than two types of ferroelectric materials through sequential depositions, and more than two conductive buffer layers such as TiN, ITO, graphene can be inserted between the deposited ferroelectric layers and the electrodes for reducing the strains and lattice mismatches, blocking the migration of metal ions during high-temperature processes, and forming good contacts. Other ferroelectric materials can include, by non-limiting example, PbZr/TiO3, BaTiO3, PbTiO3, Al-doped HfO2. Other conductive buffer layer materials can be TiN, ITO or graphene.

Also contemplated is that the dielectric material of the present disclosure can be used for connecting with loads that are intended to provide a capacitance. As the ferroelectric layer displays an inductive behavior, the dielectric layer can be used to control the resonant frequency. Based on the elementary circuit model, the smaller the capacitance of the dielectric layer, the larger the resonant frequency. As noted above, conventional capacitors themselves will not provide a voltage gain to an outside circuit. In particular, a dielectric capacitor of the present disclosure can be composed of more than two types of dielectric materials through sequential depositions for tuning a dielectric constant and a thickness of the dielectric capacitor. Further, more than two conductive buffer layers such as TiN, ITO, graphene can be inserted between the deposited dielectric layers and the electrodes for reducing the strains and lattice mismatches, blocking the migration of metal ions during high-temperature processes, and forming good ohmic contacts. Other dielectric materials can be considered to be used, by non-limiting example, SiO2, Al2O3, HfO2, ZrO2, hexagonal boron nitride (hBN).

The ferroelectric layer, sandwiched by buffer and metal layers, are combined to show the surprising inductive behavior. The conventionally estimated inductance originates from the characteristic lattice vibration frequency which is material specific. For this disclosure, our experimentally estimated inductance is at least one million times larger than conventionally estimated inductance. With the additions of the buffer layers, the present disclosure's ferroelectric capacitor shows a low-leakage current and an excellent electrical contact (low contact resistance), when compared to conventional capacitors. The addition of buffer layers also enhances the ferroelectricity.

The circuit further includes a dielectric layer sandwiched between a second metal layer and a third metal layer, such that the second metal layer extends beyond the dielectric layer and in contact with the second buffer [or metallic] layer.

The prior art uses dielectric layer and ferroelectric layer to provide a faster voltage change to accelerate the switch process of a transistor. It is empirically described by the Landau-Khalatnikov (LK) equation, and working frequency range is typically around a few kilo-Hertz. According to LK equation, there is no voltage gain around when the frequency is larger than 1 MHz. However, in contrast, the ferroelectric capacitor of the present disclosure is experimentally shown to display a surprising inductor-like behavior, whose inductance is at least one million times larger than the expected value. Combining the inductor behavior of the ferroelectric layer and capacitor behavior of the dielectric layer, the total circuit shows a resonance behavior around 10 MHz, which can be applied to matching circuit around this frequency range (1-100 MHz). The working frequency within the present disclosure is at least ten thousand times larger than the working frequency of the prior art, and the purpose is also different.

Some advantages and benefits of the ferroelectric capacitor of the present disclosure when compared to conventional capacitors, can include, by non-limiting example, include the ferroelectric capacitor illustrates a low-leakage current and an excellent electrical contact, i.e. low contact resistance, and strong ferroelectricity. The low-leakage current comes from when the buffer layer is sufficiently thick. The low contact resistance and the strong ferrorelectricity originates from that the buffer layer and the ferrorelectric layer have comparable lattice structure so that t number of strain-induced defects is limited. In other words, the material choice of the current disclosure allows the high-quality lattice.

For example, at least one use of the ferroelectric capacitor of the present disclosure, when combined into the circuit, can be for storing energy and exchanging energy and providing energy to the dielectric capacitor. Wherein the ferroelectric capacitor can exhibit characteristics of an inductor, which results in a resonance of the circuit and provide gain at a certain frequency, as noted above. One of the two terminals of the ferroelectric capacitor can be connected in series to one of the terminals of the dielectric capacitor in the circuit, and another terminal of the ferroelectric capacitor can be connected to the circuit.

Accordingly, one embodiment discloses a circuit, including a resistor, a normal capacitor and a ferroelectric capacitor are connected in series. An input terminal to provide an input voltage across the circuit. An output terminal to deliver an output voltage taken across the normal capacitor, across the ferroelectric capacitor or across the normal capacitor and the ferroelectric capacitor, wherein the circuit is an integrated circuit formed on a substrate. The circuit comprises a ferroelectric layer sandwiched between a first buffer layer and a second buffer layer. Wherein the first buffer layer contacts a portion of a surface of a first metal layer and first metal layer extends beyond the first buffer layer. A dielectric layer sandwiched between a second metal layer and a third metal layer. Such that the second metal layer extends beyond the dielectric layer and in contact with the second buffer layer. Wherein the ferroelectric capacitor is formed by the first metal layer. The ferroelectric layer sandwiched between the first buffer layer and the second buffer layer, and the second metal layer. Wherein the normal capacitor is formed by the dielectric layer and the third metal layer.

Another embodiment discloses a method for manufacturing a circuit, including providing a substrate, forming a first metal layer on the substrate, and forming a first buffer layer on the first metal layer. Further, etching away a portion of the first buffer layer to form a portion of the first metal layer extending beyond the first buffer layer. Depositing a ferroelectric oxide layer on the first buffer layer, and forming a second buffer layer on the ferroelectric oxide layer. Further still, forming a second metal layer on the second buffer layer. Wherein a ferroelectric capacitor is formed by the first metal layer, the ferroelectric oxide layer sandwiched between the first buffer layer and the second buffer layer, and the second metal layer. Depositing a dielectric layer on the second metal layer. Etching away a portion of the dielectric layer to form a portion of the second metal layer extending beyond the dielectric layer. Finally, forming a third metal layer on the dielectric layer, wherein the normal capacitor is formed by the dielectric layer and the third metal layer.

A device, including a circuit including a resistor, a normal capacitor and a ferroelectric capacitor are connected in series. An input terminal to provide an input voltage across the circuit. An output terminal to deliver an output voltage taken across the normal capacitor, across the ferroelectric capacitor or across the normal capacitor and the ferroelectric capacitor, wherein the circuit is an integrated circuit formed on a substrate. The circuit comprises a ferroelectric layer sandwiched between a first buffer layer and a second buffer layer. Wherein the first buffer layer contacts a portion of a surface of a first metal layer and first metal layer extends beyond the first buffer layer. A dielectric layer sandwiched between a second metal layer and a third metal layer. Such that the second metal layer extends beyond the dielectric layer and in contact with the second buffer layer, and the second metal layer. Wherein the ferroelectric capacitor is formed by the first metal layer, the ferroelectric layer sandwiched between the first buffer layer and the second buffer layer, such that a thickness of the ferroelectric layer is in a range of 5 nm to 30 nm. Wherein the normal capacitor is formed by the dielectric layer and the third metal layer.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

Figure 3:
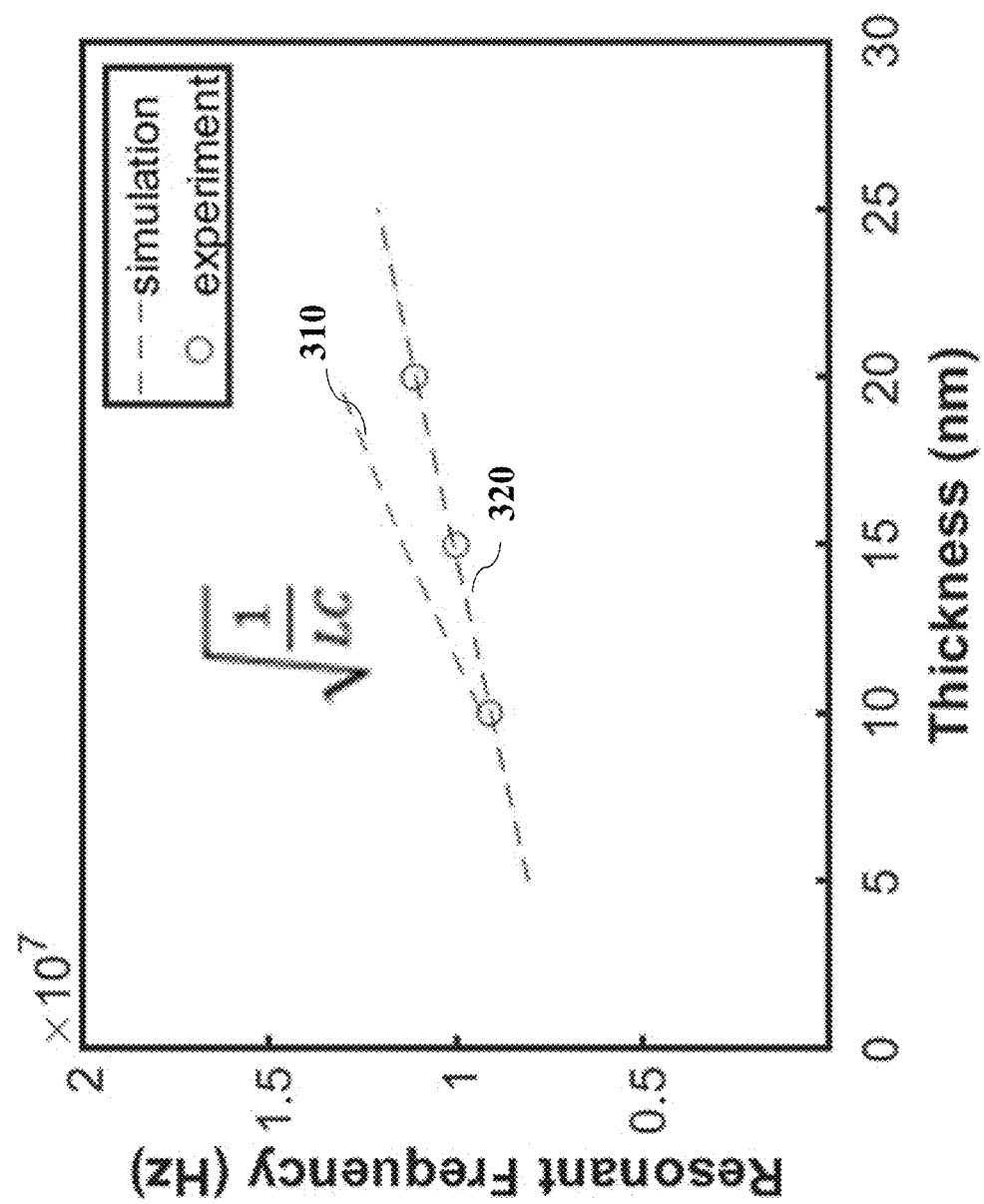
Figure 4A:
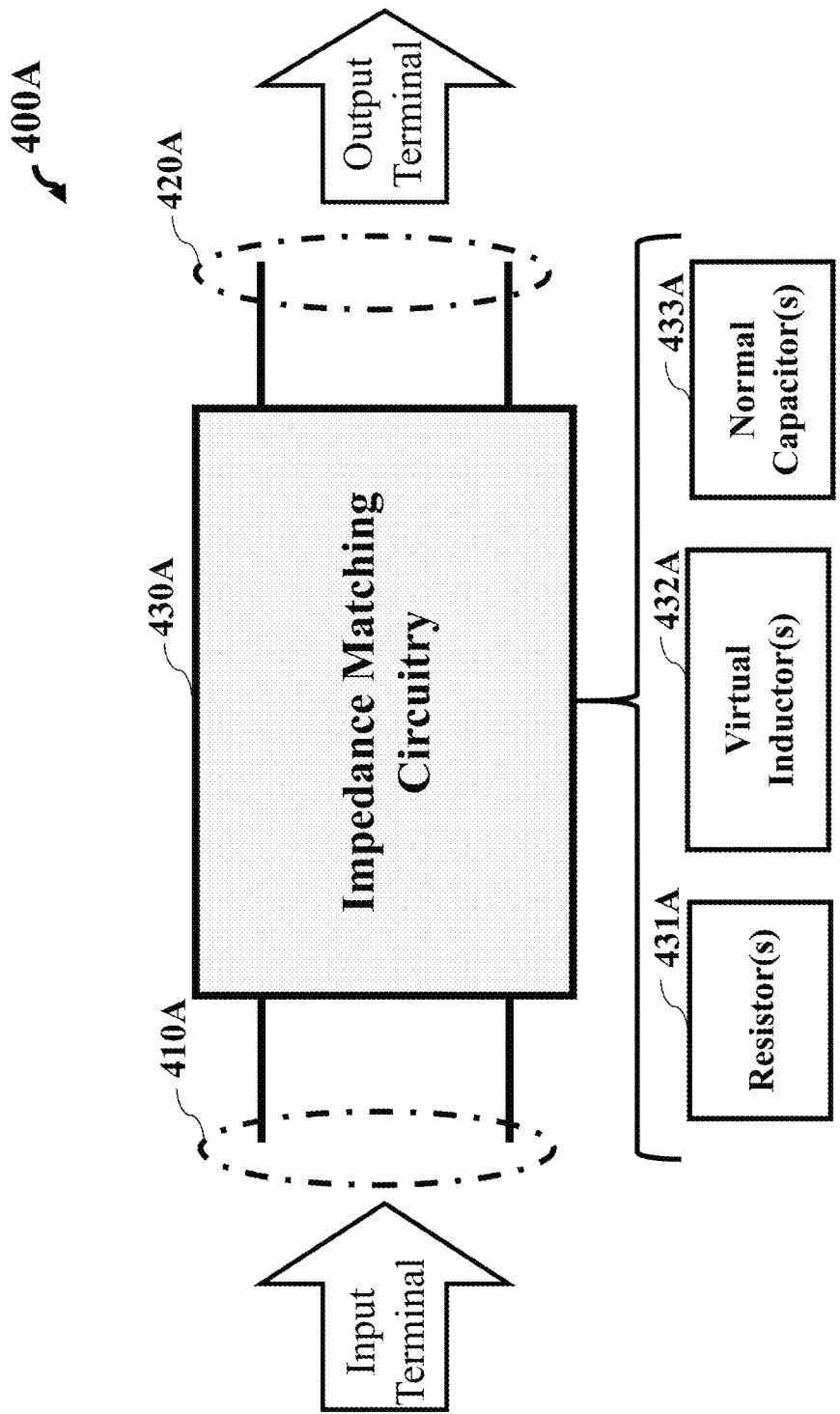
Figure 4B:
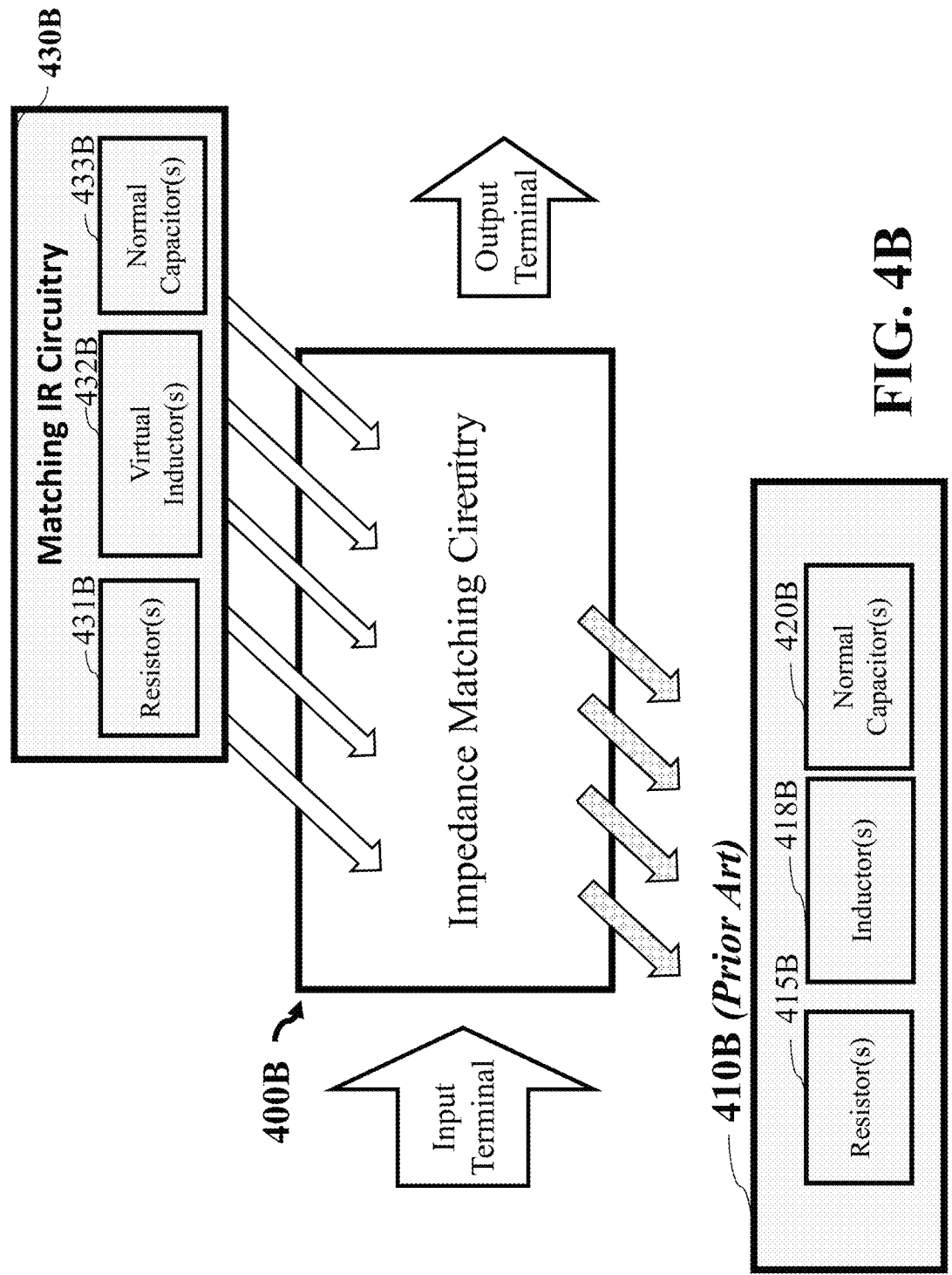
Figure 5:
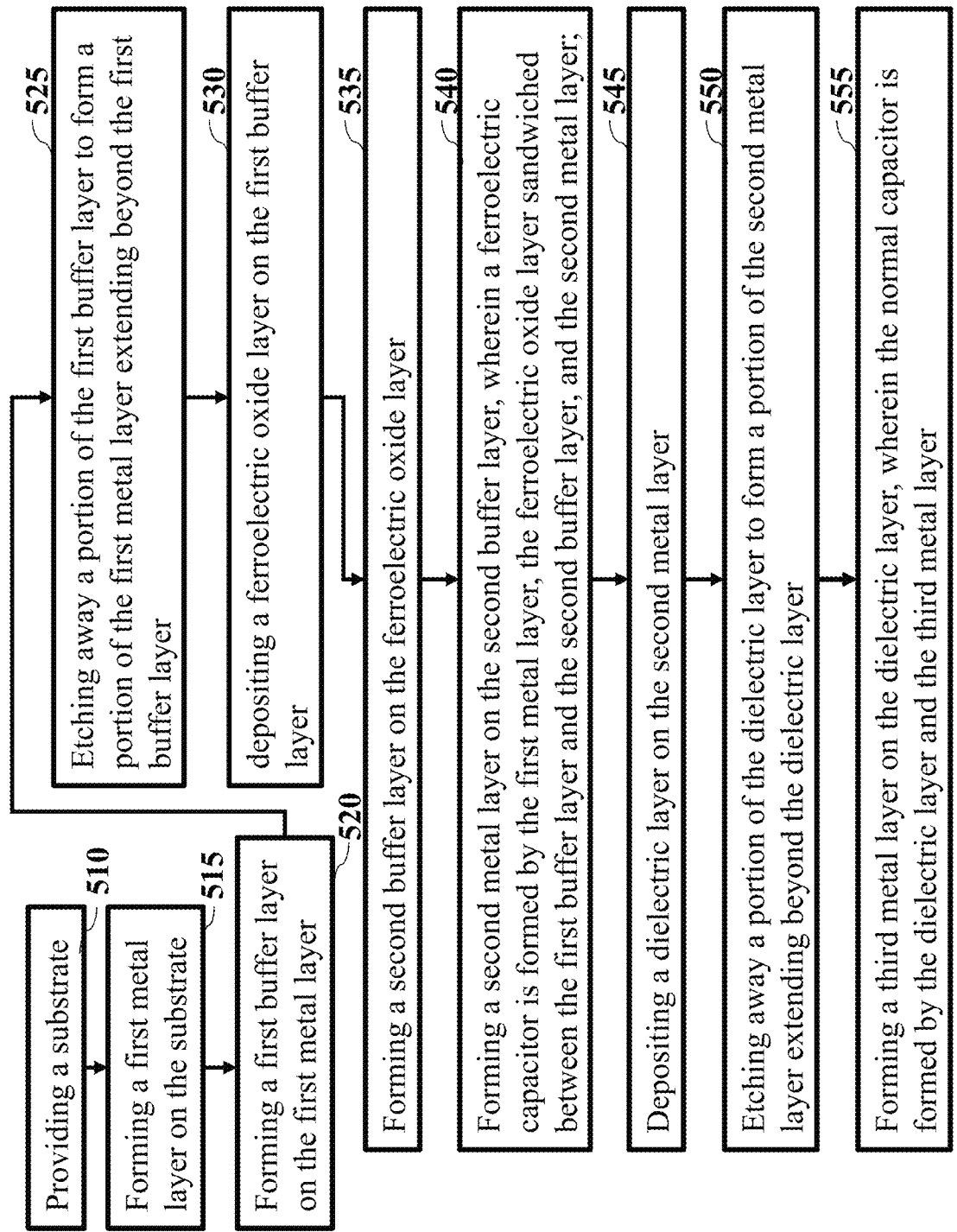

that illustrates a consistent behavior can be confirmed according to some embodiments of the present disclosure;

FIG. 3 is a graph comparing the measured resonant frequency (320) and the simulated resonant frequency (310) using the simple L-C circuit, that illustrates that the qualitative agreement is identified, according to some embodiments of the present disclosure;

FIG. 4A is a schematic illustrating some components in a circuit for the impedance-matching circuit, according to some embodiments of the present disclosure;

FIG. 4B is a schematic illustrating some components in the circuit of FIG. 4A, according to some embodiments of the present disclosure; and FIG. 5 shows a block diagram of a method for fabricating a circuit, according to some embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The present disclosure relates to signal processing, and more particularly to an integrated circuit that selectively controls a resonance frequency of a signal based on one or more dimension of at least one material in the integrated circuit.

Figure 1A:
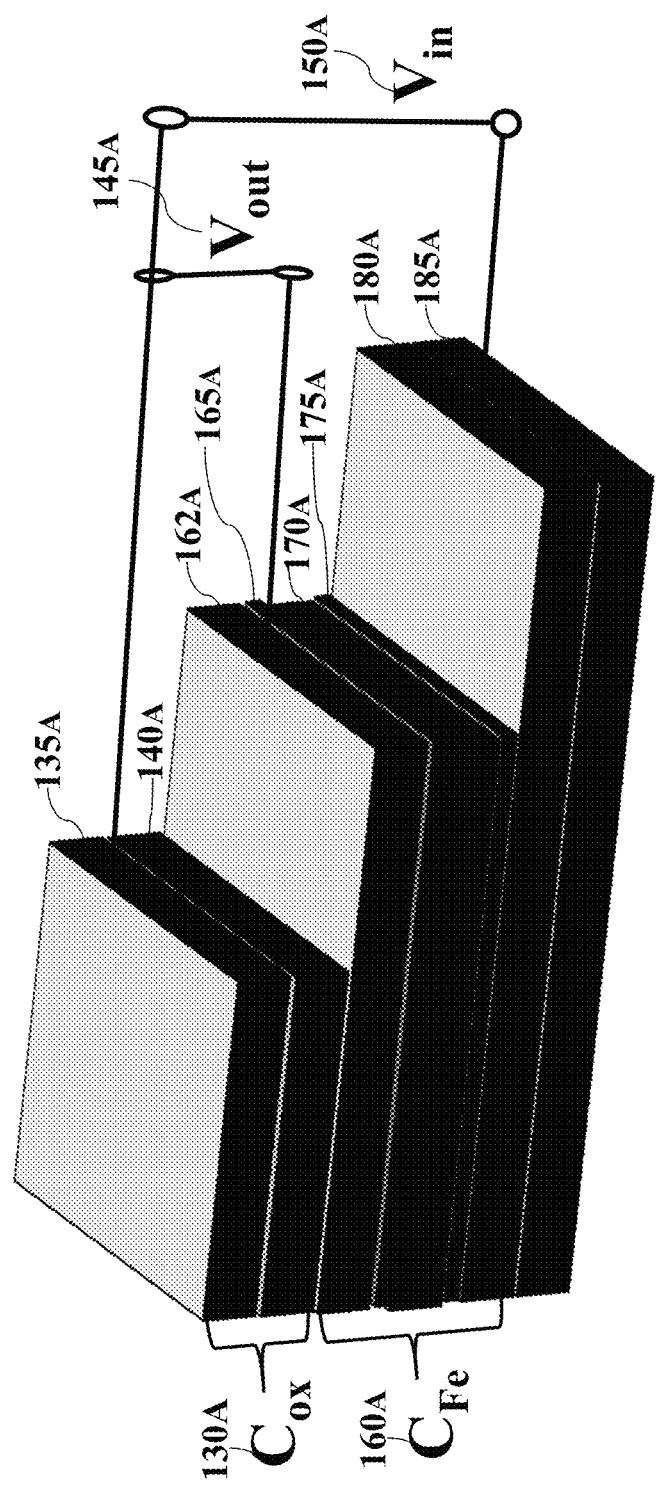
FIG. 1A is a schematic illustrating a cross section of a circuit, according to some embodiments of the present disclosure.

FIG. 1A is a schematic illustrating a cross section of a circuit, according to some embodiments of the present disclosure. For example, 130A is composed of a metal (135A) and a dielectric material (140A), and is functioned as a normal capacitor. 160A is composed of a metal (162A), two buffer layers (165A and 175A) on both sides of a ferroelectric material (170A), and is the unit of ferroelectric capacitor. 130A and 160A are grown on a substrate (185A) and a metal (180A). The voltage 145A across the dielectric material (140A) is for the filter application.

At least one unique aspect of the configuration, when the dielectric material 140A is positioned above (see FIG. 1A) the ferroelectric material 170A, is that the output voltage 145A of FIG. 1A is measured so that the resonant behavior can be observed and applied to the external circuit. In order to measure the output voltage 145A, the lateral dimension of the metal layer 162A has to be larger than the lateral size of the dielectric layer 130A, so that a wire can be connected to metal layer 135A and metal layer 162A get the output voltage 145A. The choice that 162A has larger lateral dimension than 130A in the present disclosure is not explored in the "digital" applications, as the output voltage 145A is not used in these applications.

Figure 1B:
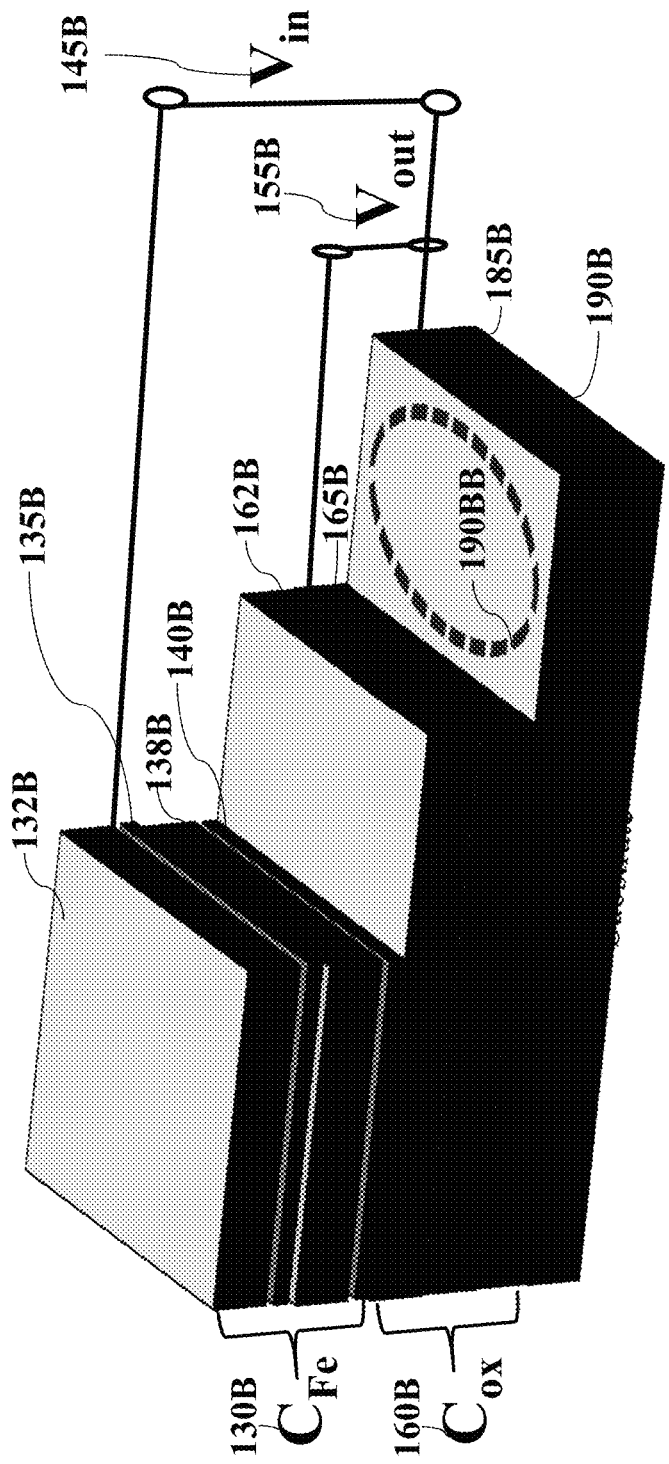
FIG. 1B is a schematic illustrating a cross section of another circuit, which is a reverse of the cross section of FIG. 1A, according to some embodiments of the present disclosure.

Referring to FIG. 1A, at least one unique aspect of the configurations of FIG. 1A and FIG. 1B according to the present disclosure, is that the output voltage 145A of FIG. 1A and the output voltage 155B of FIG. 1B are explicitly measured and show the resonant behavior. In the prior arts, these output voltages across the dielectric layer are not of interest. It is the total voltage across both dielectric and ferroelectric layers that matters. For this reason, the 130A and 160A of FIG. 1A typically have the same lateral size; the 130B and 160B of FIG. 1B typically have the same lateral size. The present disclosure explicitly uses the output voltages across the dielectric layer (the output voltage 145A of FIG. 1A and the output voltage 155B of FIG. 1B), and therefore requires that ferroelectric layer and dielectric layer have to have different lateral sizes, which is an apparent difference compared to the prior arts.

The applied voltage 150A is across both 130A and 160A, such that 145A is being used. The area and the thickness of the dielectric material 140A determine its capacitance, and values of the area and the thickness are chosen for the desired resonant frequency of interest. The area and the thickness of the ferroelectric material 170A determine its capacitance, and values of the area and the thickness are chosen for the desired resonant frequency of interest.

Referring to FIG. 1B, FIG. 1B is a schematic illustrating a cross section of another circuit, which is a reverse of the cross section of FIG. 1A, according to some embodiments of the present disclosure. For example, 160B is composed of two metals (162B and 190B) on both sides a dielectric material (165B), and is functioned as a normal capacitor. 190B is the metal substrate for a terminal for voltage input, and any area of 190B including the area of 190BB can be used as a terminal location for the voltage 155B and the voltage 145B.

Further, 130B of FIG. 1B is composed of a metal (132B), two buffer layers (135B and 140B) on both sides of a ferroelectric material (138B), is the unit of ferroelectric capacitor. 130B and 160B are grown on a substrate (185B). The voltage 155B across the dielectric material (165B) is for the filter application. The applied voltage 145B is across both 130B and 160B. FIG. 1A and FIG. 1B have the same function, but swap the vertical positions of the normal capacitor and the ferroelectric capacitor. The area and the thickness of the dielectric material 165B determine its capacitance, and values of the area and the thickness are chosen for the desired resonant frequency of interest. The area and the thickness of the ferroelectric material 138B determine its capacitance, and values of the area and the thickness are chosen for the desired resonant frequency of interest.

Referring to FIG. 1B, at least one unique aspect of the configuration where the dielectric material 165B is positioned below (see FIG. 1B) the ferroelectric material 138B, is that the output voltage 155B of FIG. 1B is measured so that the resonant behavior can be observed and applied to the external circuit. In order to measure the output voltage 155B, the lateral dimension of the metal layer 190B has to be larger than the lateral dimension of the dielectric layer 165B, and the lateral dimension of 165B has to be larger than the lateral dimension of ferroelectric layer 13B, so that a wire can be connected to metal layer 190B (or 190BB) and metal layer 165B get the output voltage 155B. The choice that 162B has larger lateral dimension than 130B in the present disclosure is not necessary in the "digital" applications, as the output voltage 155B is not used in these applications.

Figure 2A:
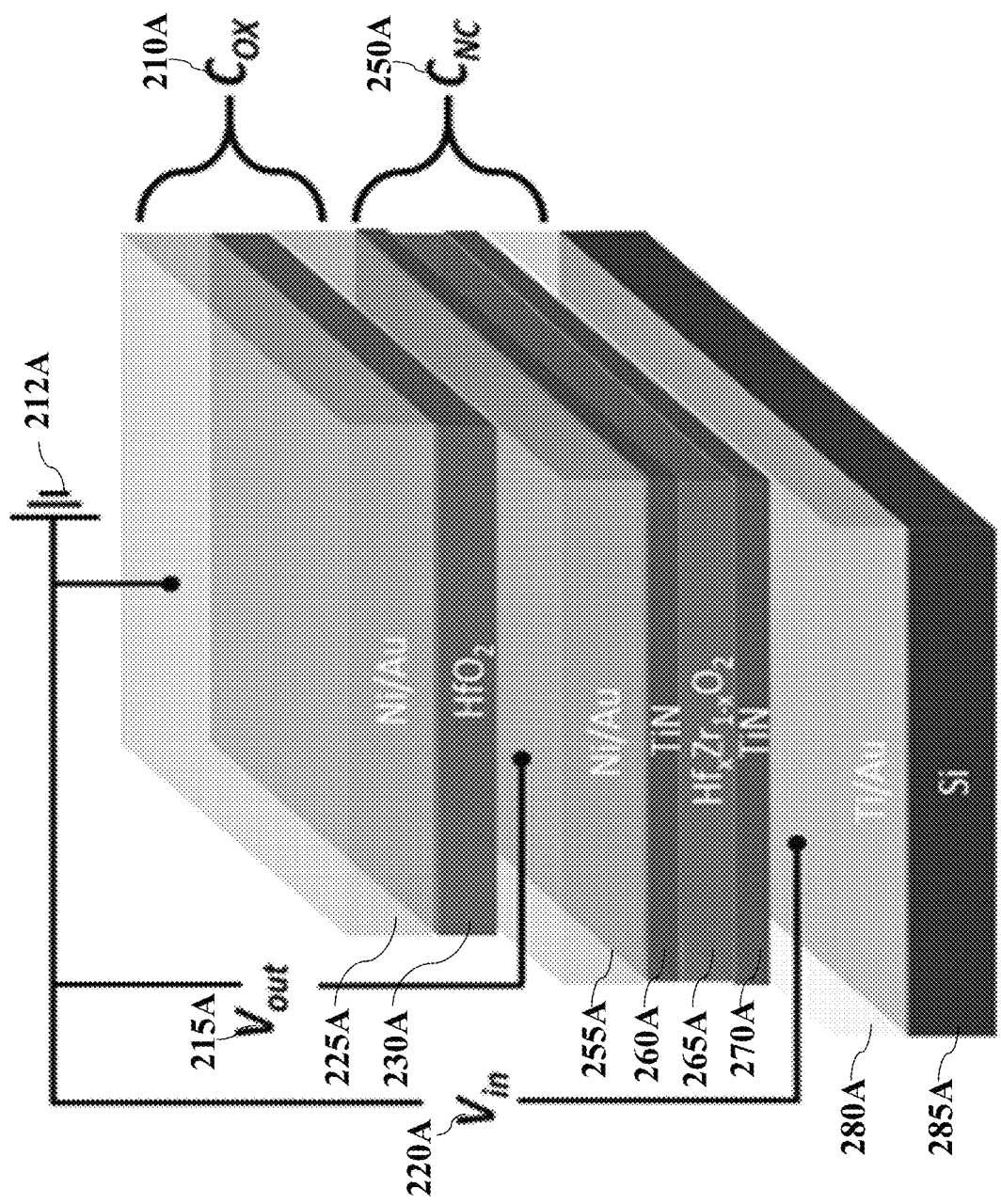
FIG. 2A is a schematic illustrating a cross section of another circuit, that includes material descriptions, according to some embodiments of the present disclosure.

FIG. 2A is a schematic illustrating a cross section of another circuit, that includes material descriptions, according to some embodiments of the present disclosure. For example, 210A is composed of a metal (225A), which can be nickel or gold, and a dielectric material (230A), which can be $HfO_2$, and is functioned as a normal capacitor. 250A is composed of a metal (255A), two buffer layers (260A and 270A), which can be TiN, on both sides of a ferroelectric material (265A), which is an Zr doped $HfO_2$, is the unit of ferroelectric capacitor. 210A and 250A are grown on a Silicon substrate (285A) and a metal (280A). The voltage 215A across the dielectric material (230A) is for the filter application. The applied voltage 220A is across both 210A and 250A. 215A which is a unique aspect of the present disclosure, as this voltage drop is not used when it is used to provide a fast switch of a transistor. In one possible embodiment, the metal layer 225A is 150 μm×150 μm×50 nm; the $HfO_2$ dielectric layer is 150 μm×150 μm×(10-20 nm), the metal layer 255A is 400 μm×400 μm×50 nm, and two TiN buffer layers 260A and 270A are 400 μm×400 μm×(10-60 nm). The bottom metal layer is about 80 nm thick, the dimension of Si substrate 285A is determined by the commercial wafer, which can have a much larger lateral size than those of 210A and 250A.

Figure 2B:
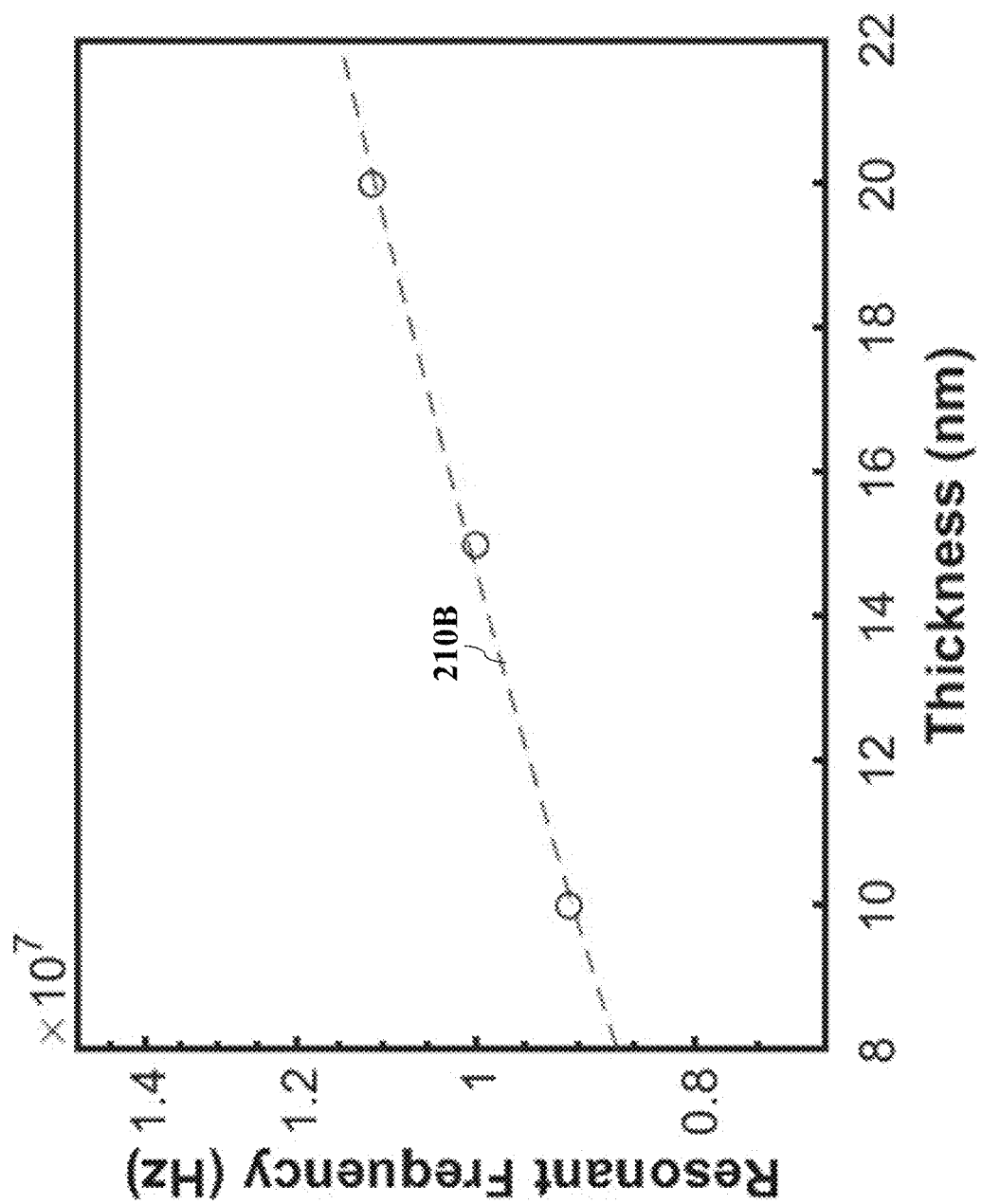
FIG. 2B is a plot of the resonant frequency as a function of the thickness of the dielectric material, which illustrates the resonant frequencies of FIGS. 1A and 1B can be tuned by adjusting a thickness of the dielectric layer and the ferroelectric layer, according to some embodiments of the present disclosure.

FIG. 2B is a plot of the resonant frequency as a function of the thickness of the dielectric material (210B). The resonant frequencies of the devices/circuits of FIGS. 1A and 1B can be tuned by adjusting the thickness of the dielectric layer and the ferroelectric layer, according to embodiments of the present disclosure. 210B shows that the resonant frequency increases as the thickness of dielectric material increases, indicating the resonance comes from inductive nature of the ferroelectric material.

Figure 2C:
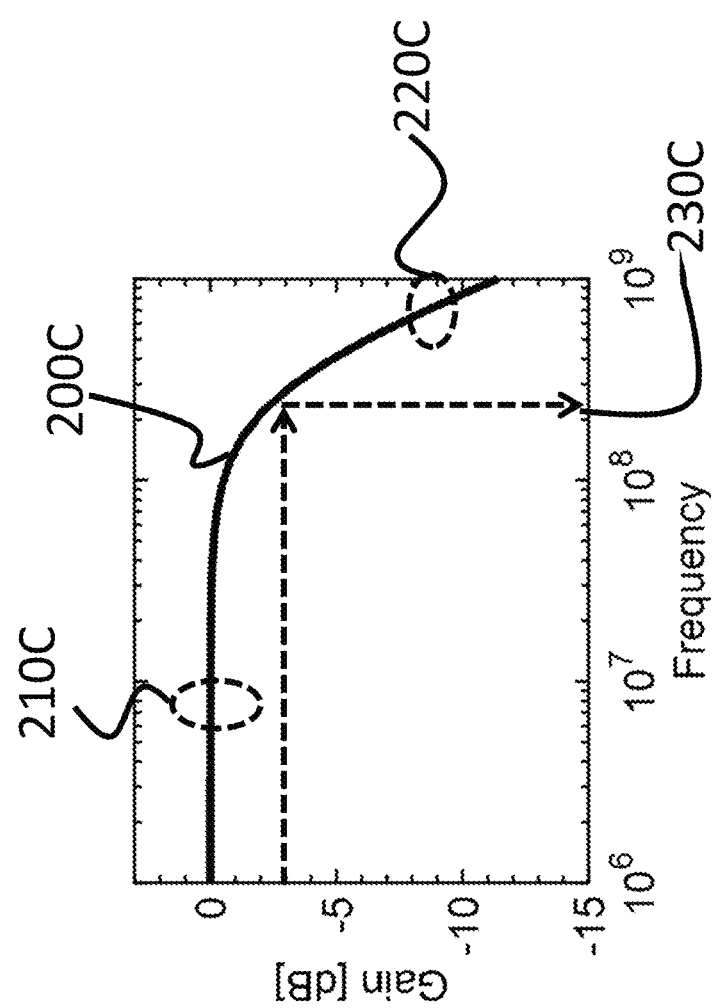
FIG. 2C (Prior Art) is a graph illustrating an exemplar Gain vs Frequency curve for a first order passive low pass filter, for a resistor and a conventional normal capacitor.

FIG. 2C (Prior Art) is a graph illustrating an exemplar Gain vs Frequency curve for a first order passive low pass filter. For example, FIG. 2C shows an exemplar Gain vs Frequency curve 200C for a first order passive low pass filter. Here Gain is defined as 20 log(H(f)) wherein H(f) =$V_{out}$(f)/$V_{in}$(f). The value of Gain for a passive filter in the pass band 210C is either 0 dB or slightly less than that. A cut off frequency 230C is defined such that the gain at that point is −3 dB. The power roll off 220C, i.e., the slope of Gain curve 200C in the stop band beyond cutoff frequency, is −20 dB/decade. A $1^{st}$ order low pass filter cannot provide a gain greater than 0 dB and a power roll off with a value more than −20 dB/decade around and beyond a cutoff frequency. Without the inductance, there is no resonant behavior, i.e. voltage gain over a certain frequency window, in the plot. In the real experiment, a resonant peak around $10^7$ Hz (around 210C) is observed, indicating that ferroelectric layer does not function like a normal capacitor.

Figure 2D:
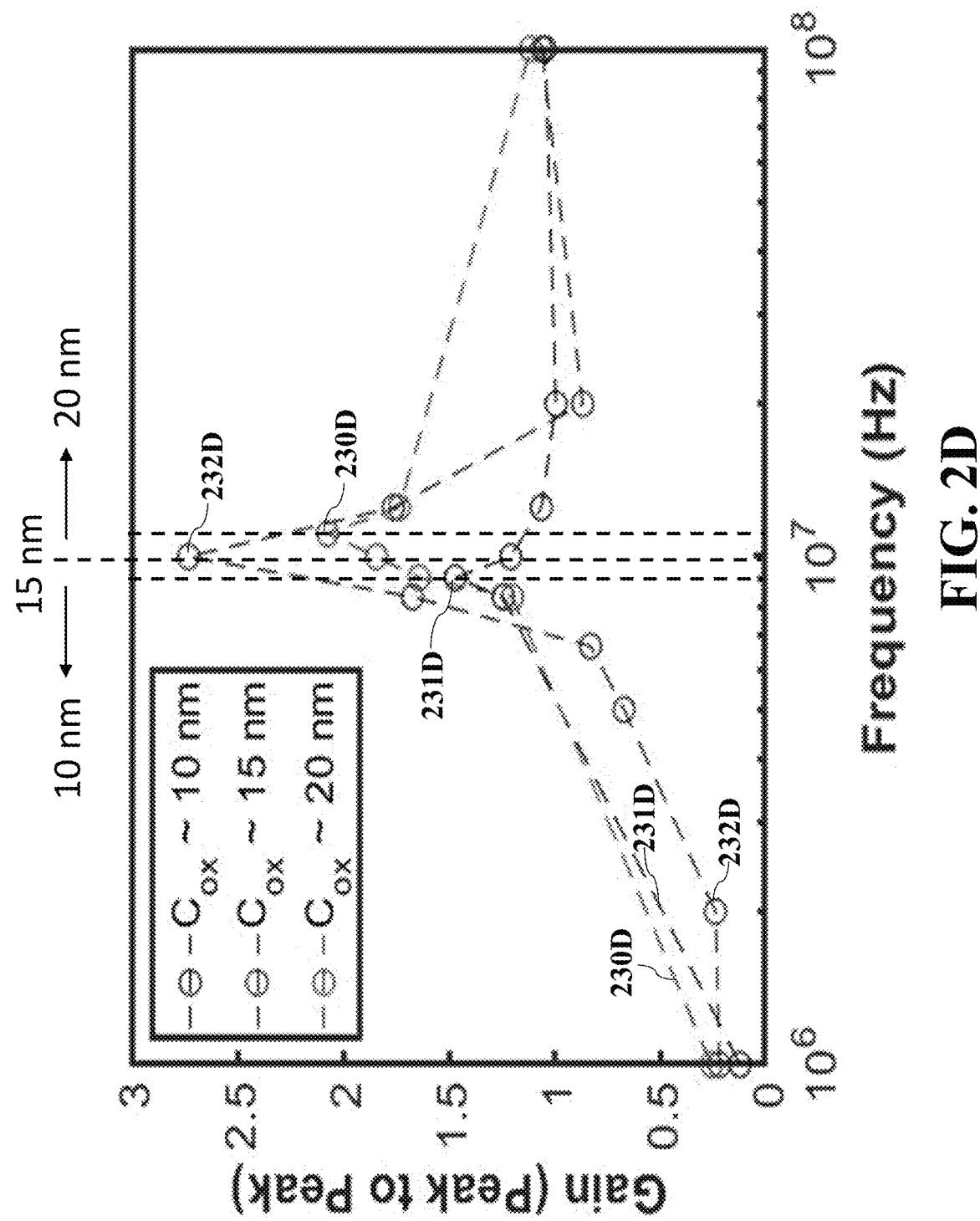
FIG. 2D is a graph illustrating a voltage gain of the circuit of FIG. 2A for different designed thicknesses of the dielectric layer ($HfO_2$), wherein the resonant behavior is observed, and the resonant frequency is a function of the designed thickness of the dielectric layer ($HfO_2$) in the device, according to some embodiments of the present disclosure.

FIG. 2D is a graph illustrating a voltage gain of the circuit of FIG. 2A for different designed thicknesses of the dielectric layer ($HfO_2$). The resonant behavior is observed, and the resonant frequency is a function of the designed thickness of the dielectric layer ($HfO_2$) in the device, according to embodiments of the present disclosure. 230D corresponds to the gain using 20 nm $HfO_2$, 231D corresponds to the gain using 10 nm $HfO_2$, and 232D corresponds to the gain using 15 nm $HfO_2$. Noted, that the thicker $HfO_2$ has smaller capacitance and larger resonant frequency.

Figure 2E:
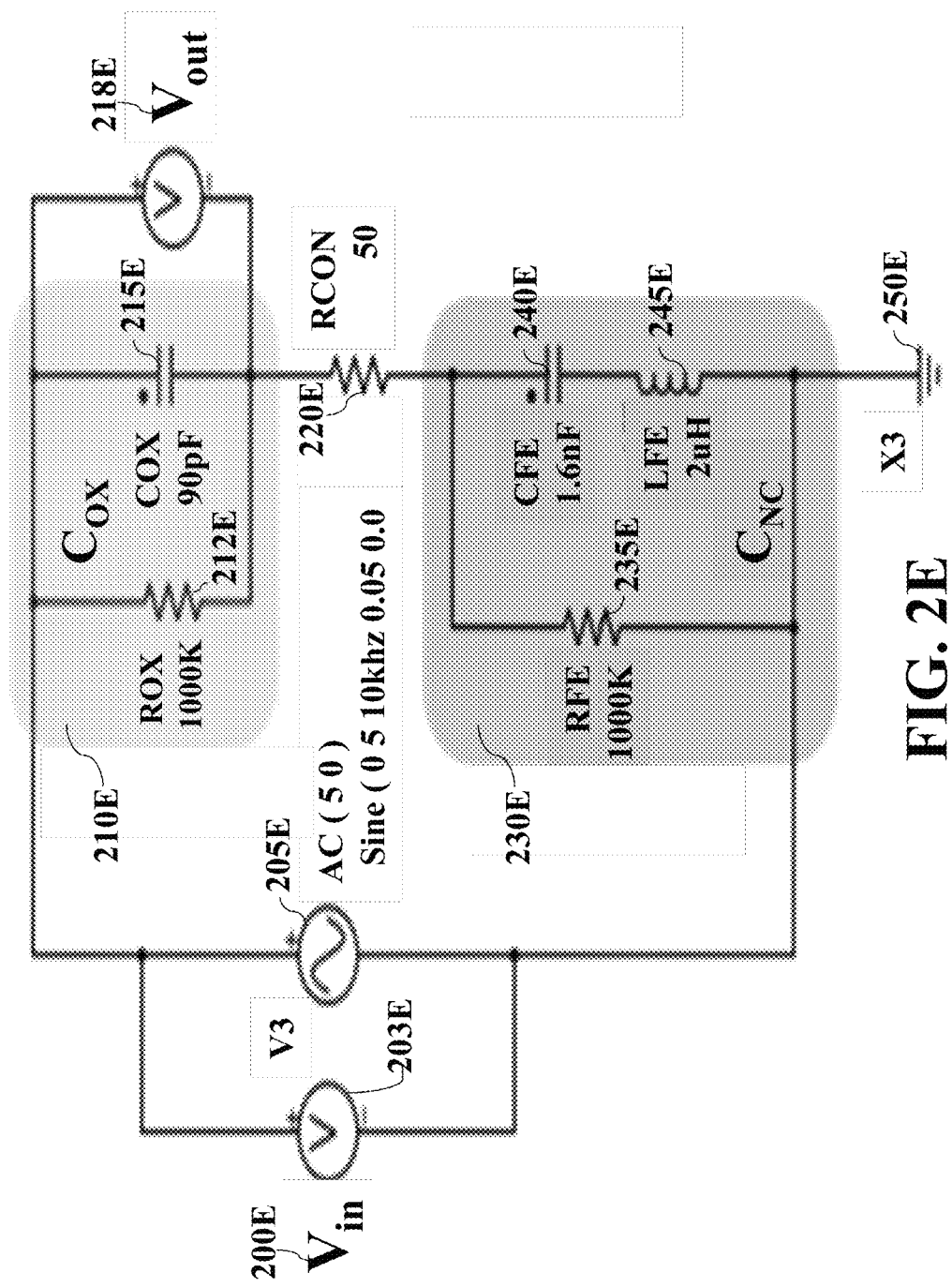
FIG. 2E is a schematic illustrating the effective circuit of the device in FIG. 1A, according to some embodiments of the present disclosure.

FIG. 2E is a schematic illustrating the effective circuit of the device given in FIG. 1A, according to embodiments of the present disclosure. For example, 210E represents the effective circuit of the dielectric material, including a resistor 212E and a normal capacitor 215E. 230E represents the effective circuit of ferroelectric material, including a resistor 235E, a capacitor 240E, and an inductor 245E. 210E and 230E are connected by a resistor 220E. 250E represents the ground voltage. 205E is the AC voltage source. 218E measures the voltage across the dielectric material, which is a unique aspect of the present disclosure. 200E measures the voltage across both 210E and 230E.

Figure 2F:
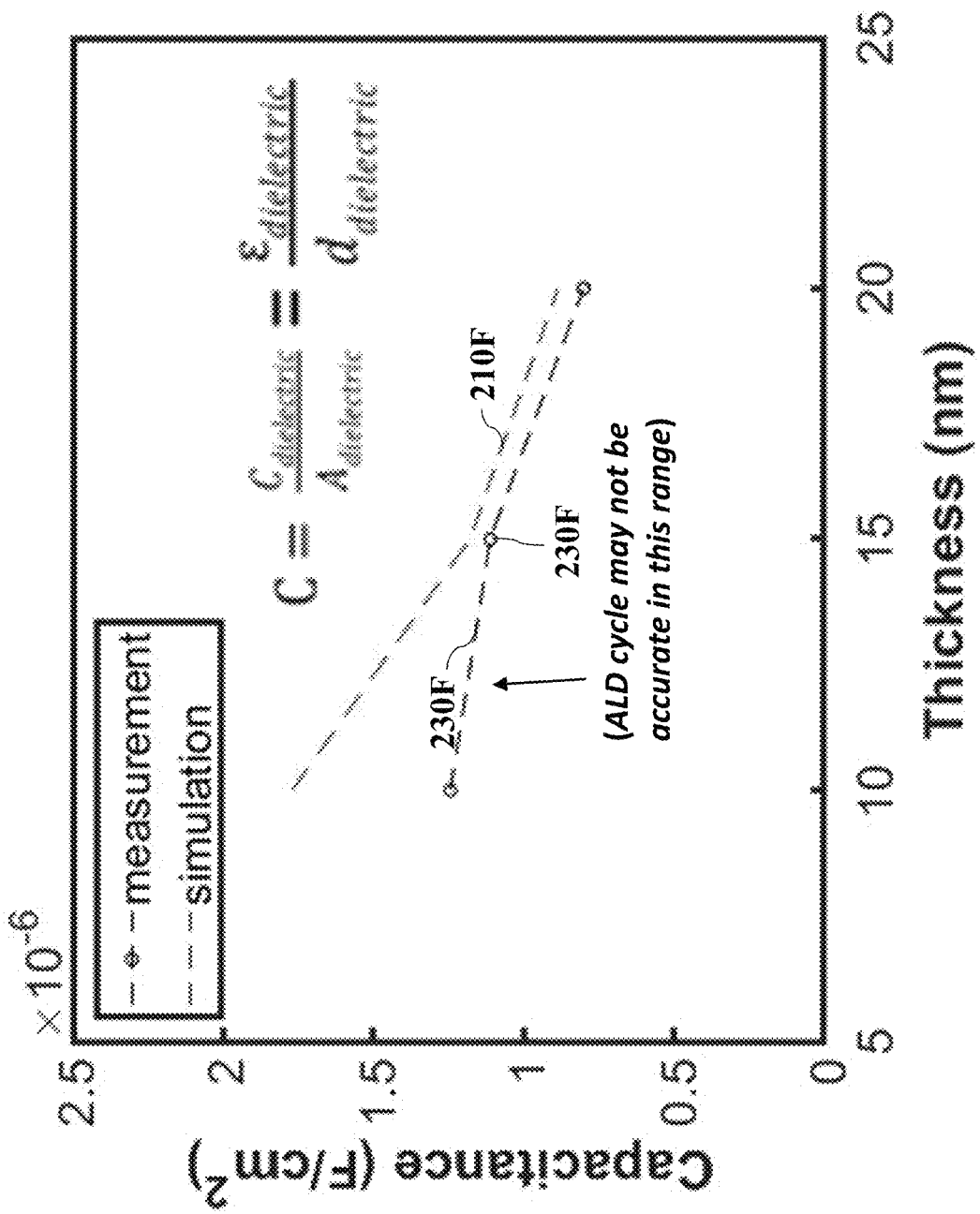
FIG. 2F is a graph comparing the measured capacitance and the simulated capacitance using the formula $$C = \frac{\varepsilon_{dielectric}}{d_{electric}},$$

FIG. 2F is a graph comparing the measured capacitance 230F and the simulated capacitance 210Fs using the formula $$C = \frac{\varepsilon_{dielectric}}{d_{electric}},$$

according to some embodiments of the present disclosure. A consistent behavior is confirmed.

FIG. 3 is a graph comparing the measured resonant frequency 320 and the simulated resonant frequency 310 using the simple L-C circuit. The qualitative agreement is seen. Using the measured capacitance value 230F of FIG. 2F, the inductance of the ferroelectric unit 250A of FIG. 2A is about 2 μH.

FIG. 4A is a schematic illustrating some components in a circuit for the impedance-matching circuit, according to some embodiments of the present disclosure. For example, 410A is the input terminal where an input AC signal is injected, and 420A is the output terminal where an AC signal is transmitted. 430A is the impedance matching circuitry that contains a combination of resistor(s) 431A, normal capacitor(s) 433A, and virtual inductor(s) 432A. 431A, 432A, 433A are connected in series and/or parallel, and their order can vary. The virtual inductor 432A, which uses ferroelectric material and is depicted in FIG. 1, can be significantly more compact than the normal inductor.

FIG. 4B is a schematic illustrating some components in the circuit of FIG. 4A, according to some embodiments of the present disclosure. For example, 400B is the impedance matching circuitry including an input terminal and an output terminal. 410B is the conventional impedance matching circuitry that includes combination of resistor(s) 415B, normal inductor(s) 418B, and normal capacitor(s) 420B. 430B is identical to 430A of FIG. 4A, which is our invention. The inductor 418B of 410B is replaced by the virtual inductors 432B.

FIG. 5 shows a block diagram of a method for fabricating a circuit, according to some embodiments of the present disclosure. For example, step 510 includes providing a commercially obtained Silicon substrate. Step 515 includes forming a first metal layer on the substrate. Step 520 includes forming a first buffer layer on the first metal layer. Step 525 includes etching away a portion of the first buffer layer to form a portion of the first metal layer extending beyond the first buffer layer. Step 530 includes depositing a ferroelectric oxide layer on the first buffer layer. Step 535 includes forming a second buffer layer on the ferroelectric oxide layer. Step 540 includes forming a second metal layer on the second buffer layer, wherein a ferroelectric capacitor is formed by the first metal layer, the ferroelectric oxide layer sandwiched between the first buffer layer and the second buffer layer, and the second metal layer. Step 545 includes depositing a dielectric layer on the second metal layer. Step 550 includes etching away a portion of the dielectric layer to form a portion of the second metal layer extending beyond the dielectric layer. Step 555 includes forming a third metal layer on the dielectric layer, wherein the normal capacitor is formed by the dielectric layer and the third metal layer.

Features

An aspect of the present disclosure includes the ferroelectric layer sandwiched between a first buffer layer and a second buffer layer, wherein the first buffer layer contacts a portion of a surface of a first metal layer and first metal layer extends beyond the first buffer layer. For example, the first buffer layer contacts at least 55%, of a top surface area of a first metal layer. Wherein an aspect can be that the first metal layer extends beyond an end of the first buffer layer by one of, at least a 25% length, of a total length of the first buffer layer.

Another aspect of the present disclosure can include the dielectric layer sandwiched between a second metal layer and a third metal layer, such that the second metal layer extends beyond the dielectric layer and in contact with the second buffer layer. Wherein an aspect can include the dielectric layer contacts at least 55% of a top surface area of the second metal layer. Another aspect can be that the second metal layer extends beyond an end of the dielectric layer by at least a 25% length, of a total length of the dielectric layer.

An aspect of the present disclosure includes the ferroelectric layer that is a Ferroelectric Oxide (FEO) layer, and the first and second buffer layers are metallic.

Wherein a thickness of the FEO layer is less than a critical thickness $T_c$ determined based on $T_c = 1/(2\alpha C_{cap})$, wherein α is a material based parameter of the FEO layer, and $C_{cap}$ is a capacitance of the normal capacitor. Wherein the FEO layer includes one or combination of Barium titanate ($BaTiO_3$), Strontium titanate ($SrTiO_3$), Hafnium Zirconium Oxide (HfZrOx) and Doped Hafnium oxide. Wherein material of the FEO layer is doped. At least one benefit of these aspects is that each aspect contributes to the uniqueness of the properties exhibited by the ferroelectric capacitor. Another aspect can be that the thickness of the FEO layer is less than the critical thickness $T_c$ and in a range of a range of 5 nm to 50 nm, so as to achieve a resonance frequency between $10^6$ to $10^8$ Hz in the circuit. Another aspect can be that the thickness of the FEO layer is in a range of 5 nm to 50 nm, so as to achieve a resonance frequency between $10^6$ to $10^8$ Hz in the circuit.

According to another aspect of the present disclosure, the output voltage is taken across the normal capacitor, such that the circuit behaves similar to a resonant circuit. An aspect can include the first metal layer is arranged on the substrate. Another aspect can be that the first metal layer and third metal layer serve as the input terminal, and second metal layer and third metal layer serve as the output terminal. Also, another aspect can be that the first buffer layer and the second buffer layer are one of same materials or different materials, such that at least one material is ceramic material such as Titanium Nitride (TiN). At least one benefit of these aspects is that each aspect contributes to the uniqueness of the properties exhibited by the ferroelectric capacitor.

According to another aspect of the present disclosure, a total lateral area of a combined rectangular prism can be a combined cubic foot of the third metal layer and the dielectric layer less a total lateral area of a combined rectangular prism of a combined cubic foot of the second metal layer, the first buffer layer, the ferroelectric layer, the second buffer layer and the first metal layer. An aspect can include a cubic foot of the FEO layer that is 100-2000 $\mu m^3$, so as to achieve a resonance frequency between $10^6$ to $10^8$ Hz in the circuit. Another aspect can be that at least one dimension of the dielectric layer is selected based on a function of a resonance frequency in the circuit. Another aspect may be that the at least one dimension includes a thickness of the dielectric layer, the lateral area of the dielectric layer, or both. It is possible that a change in the at least one dimension directly corresponds to a change in a frequency range of the circuit, which corresponds to a change in a capacitance of the circuit, which corresponds to a change in the resonance frequency in the circuit.

According to another aspect of the present disclosure, at least one dimension of the dielectric layer is selected based on a function of a resonance frequency in the circuit. Wherein the at least one dimension includes a thickness of the dielectric layer, an area of the dielectric layer, or both. Wherein a change in at least one dimension directly corresponds to a change in a frequency range of the circuit, which corresponds to a change in a capacitance of the circuit, which corresponds to a change in the resonance frequency in the circuit. At least one benefit of these aspects is that each aspect contributes to the uniqueness of the properties exhibited by the ferroelectric capacitor.

According to another aspect of the present disclosure, patterning a surface of the third metal layer not adjacent to the dielectric layer. Also another aspect can be that one or combination of the dielectric layer and the ferroelectric oxide layer are deposited using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition. Further, an aspect can be that the first metal layer and third metal layer serve as the input terminal, and second metal layer and third metal layer serve as the output terminal. At least one benefit of these aspects is that each aspect contributes to the uniqueness of the properties exhibited by the ferroelectric capacitor.

An aspect of the present disclosure can include the ferroelectric material that is Zr-doped HfO2, and a thickness of at least one buffer layer of the first and the second buffer layers is in a range of 5 nm to 50 nm, and a thickness of the dielectric layer is in a range of 5 nm to 50 nm. At least one benefit of these aspects is that each aspect contributes to the uniqueness of the properties exhibited by the ferroelectric capacitor.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided.

Components connected in series: Components of an electrical circuit or electronic circuit can be connected in series, wherein the components connected in series are connected along a single path, so the same current flows through all of the components.

Electromagnetism: Is a branch of physics involving the study of the electromagnetic force, a type of physical interaction that occurs between electrically charged particles. The electromagnetic force usually exhibits electromagnetic fields such as electric fields, magnetic fields, and light, and is one of the four fundamental interactions (commonly called forces) in nature. An electromagnetic field (also EMF or EM field) can be a physical field produced by electrically charged objects, that affects the behavior of charged objects in the vicinity of the field (see diagram to right). The electromagnetic field extends indefinitely throughout space and describes the electromagnetic interaction. Electromagnetic phenomena are defined in terms of the electromagnetic force, sometimes called the Lorentz force, which includes both electricity and magnetism as different manifestations of the same phenomenon.

Magnetic field: Is a vector field that describes the magnetic influence of electrical currents and magnetized materials. In everyday life, the effects of magnetic fields are often seen in permanent magnets, which pull on magnetic materials (such as iron) and attract or repel other magnets. Magnetic fields surround and are created by magnetized material and by moving electric charges (electric currents) such as those used in electromagnets. Magnetic fields exert forces on nearby moving electrical charges and torques on nearby magnets. In addition, a magnetic field that varies with location exerts a force on magnetic materials. Both the strength and direction of a magnetic field varies with location. As such, it is an example of a vector field. Magnetic fields are produced by moving electric charges and the intrinsic magnetic moments of elementary particles associated with a fundamental quantum property, their spin. Magnetic fields and electric fields are interrelated, and are both components of the electromagnetic force, one of the four fundamental forces of nature.

Inductance: In electromagnetism and electronics, inductance is the property of an electrical conductor by which a change in electric current through it induces an electromotive force (voltage) in the conductor. It is more accurately called self-inductance. The same property causes a current in one conductor to induce an electromotive force in nearby conductors; this is called mutual inductance. Inductance is an effect caused by the magnetic field of a current-carrying conductor acting back on the conductor. An electric current through any conductor creates a magnetic field around the conductor. A changing current creates a changing magnetic field. From Faraday's law of induction any change in magnetic flux through a circuit induces an electromotive force (voltage) across the circuit. Inductance is the ratio L between this induced voltage v and the rate of change of the current i(t) in the circuit:

$$v = L\frac{di(t)}{dt}.$$

Where, from Lenz's law, this induced voltage, or "back EMF", will be in a direction so as to oppose the change in current which created it. Thus inductance is a property of a conductor which opposes any change in current through the conductor. An inductor is an electrical component which adds inductance to a circuit. It typically consists of a coil or helix of wire. Electric circuits which are located close together, so the magnetic field created by the current in one passes through the other, are said to be inductively coupled. A change in current in one circuit will cause the magnetic flux through the other circuit to vary, which will induce a voltage in the other circuit, by Faraday's law. The ratio of the voltage induced in the second circuit to the rate of change of current in the first circuit is called the mutual inductance M between the circuits.

Source of Inductance: A current i flowing through a conductor generates a magnetic field around the conductor, which is described by Ampere's circuital law. The total magnetic flux through a circuit Φ is equal to the product of the magnetic field and the area of the surface spanning the current path. If the current varies, the magnetic flux Φ through the circuit changes. By Faraday's law of induction, any change in flux through a circuit induces an electromotive force (EMF) or voltage v in the circuit, proportional to the rate of change of flux:

$$v(t) = -\frac{d\Phi(t)}{dt}.$$

Self-inductance, usually just called inductance, L is the ratio between the induced voltage and the rate of change of the current:

$$v = L\frac{di(t)}{dt}.$$

Thus, inductance is a property of a conductor or circuit, due to its magnetic field, which tends to oppose changes in current through the circuit. The unit of inductance in the SI system is the henry (H), which is the amount of inductance which generates a voltage of one volt when the current is changing at a rate of one ampere per second. All conductors have some inductance, which may have either desirable or detrimental effects in practical electrical devices. The inductance of a circuit depends on the geometry of the current path, and on the magnetic permeability of nearby materials; ferromagnetic materials with a higher permeability like iron near a conductor tend to increase the magnetic field and inductance. Any alteration to a circuit which increases the flux (total magnetic field) through the circuit produced by a given current increases the inductance, because inductance is also equal to the ratio of magnetic flux to current:

$$L = \frac{\Phi(i)}{i}.$$

An inductor is an electrical component consisting of a conductor shaped to increase the magnetic flux, to add inductance to a circuit. Typically it consists of a wire wound into a coil or helix. A coiled wire has a higher inductance than a straight wire of the same length, because the magnetic field lines pass through the circuit multiple times, it has multiple flux linkages. The inductance is proportional to the square of the number of turns in the coil.

Parasitic inductance: Is an unwanted inductance effect that is unavoidably present in all real electronic devices. As opposed to deliberate inductance, which is introduced into the circuit by the use of an inductor, parasitic inductance is almost always an undesired effect.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

What is claimed is:

1. A circuit, comprising:
a resistor, a normal capacitor and a ferroelectric capacitor are connected in series;
an input terminal to provide an input voltage across the circuit; and
an output terminal to deliver an output voltage taken across the normal capacitor, across the ferroelectric capacitor or across the normal capacitor and the ferroelectric capacitor, such that the circuit behaves as a resonant circuit, wherein the circuit is an integrated circuit formed on a substrate, the circuit comprises:
a ferroelectric layer sandwiched between a first buffer layer and a second buffer layer, wherein the first buffer layer contacts a portion of a surface of a first metal layer and the first metal layer extends beyond the first buffer layer; and
a dielectric layer sandwiched between a second metal layer and a third metal layer, such that the second metal layer extends beyond the dielectric layer and in contact with the second buffer layer, wherein the ferroelectric capacitor is formed by the first metal layer and the second metal layer, and wherein the normal capacitor is formed by the dielectric layer and the third metal layer.

2. The circuit of claim 1, wherein the ferroelectric layer is a Ferroelectric Oxide (FEO) layer, and the first buffer layer and the second buffer layer are metallic.

3. The circuit of claim 2, wherein a thickness of the FEO layer is less than a critical thickness $T_c$ determined based on $$T_c = 1/(2\alpha C_{cap}),$$

wherein α is a material based parameter of the FEO layer, $C_{cap}$ is a capacitance of the normal capacitor.

4. The circuit of claim 2, wherein the FEO layer includes one or combination of Barium titanate ($BaTiO_3$), Strontium titanate (SrTiO3), Hafnium Zirconium Oxide (HfZrOx) and Doped Hafnium oxide.

5. The circuit of claim 2, wherein a material of the FEO layer is doped.

6. The circuit of claim 1, wherein the first buffer layer and the second buffer layer are one of same materials or different materials, such that at least one material is a ceramic material including Titanium Nitride (TiN).

7. The circuit of claim 1, wherein the first metal layer is arranged on the substrate.

8. The circuit of claim 1, wherein a total lateral area of a combined rectangular prism is equal to a combined cubic foot of the third metal layer and the dielectric layer, the dielectric layer having a lateral area which is less than a total lateral area of a second combined rectangular prism that is a combined cubic foot of the second metal layer, the first buffer layer, the ferroelectric layer, the second buffer layer and the first metal layer.

9. The circuit of claim 1, wherein at least one dimension of the dielectric layer is selected based on a function of a resonance frequency in the circuit.

10. The circuit of claim 9, wherein the at least one dimension includes a thickness of the dielectric layer, a lateral area of the dielectric layer, or both.

11. The circuit of claim 10, wherein a change in at least one of the dimensions of the dielectric layer directly corresponds to a change in a working frequency range of the circuit, which corresponds to a change in a capacitance of the circuit, which corresponds to a change in the resonance frequency in the circuit.

12. A circuit, comprising:
a resistor, a normal capacitor and a ferroelectric capacitor are connected in series;
an input terminal to provide an input voltage across the circuit; and
an output terminal to deliver an output voltage taken across the normal capacitor, across the ferroelectric capacitor or across the normal capacitor and the ferroelectric capacitor, and the first metal layer and third metal layer serve as the input terminal, and second metal layer and third metal layer serve as the output terminal, wherein the circuit is an integrated circuit formed on a substrate, the circuit comprises:
a ferroelectric layer sandwiched between a first buffer layer and a second buffer layer, wherein the first buffer layer contacts a portion of a surface of a first metal layer and the first metal layer extends beyond the first buffer layer; and
a dielectric layer sandwiched between a second metal layer and a third metal layer, such that the second metal layer laterally extends beyond the dielectric layer and in contact with the second buffer layer, wherein the ferroelectric capacitor is formed by the first metal layer and the second metal layer, and wherein the normal capacitor is formed by the dielectric layer and the third metal layer.

13. A device, comprising:
a circuit including a resistor, a normal capacitor and a ferroelectric capacitor are connected in series;
an input terminal to provide an input voltage across the circuit; and
an output terminal to deliver an output voltage taken across the normal capacitor, across the ferroelectric capacitor or across the normal capacitor and the ferroelectric capacitor, such that the circuit behaves as a resonant circuit, wherein the circuit is an integrated circuit formed on a substrate, the circuit comprises:
a ferroelectric layer sandwiched between a first buffer layer and a second buffer layer, wherein the first buffer layer contacts a portion of a surface of a first metal layer and the first metal layer extends beyond the first buffer layer; and
a dielectric layer sandwiched between a second metal layer and a third metal layer, such that the second metal layer extends beyond the dielectric layer and in contact with the second buffer layer, wherein the ferroelectric capacitor is formed by the first metal layer and the second metal layer, and a thickness of the ferroelectric layer is in a range of 5 nm to 30 nm, wherein the normal capacitor is formed by the dielectric layer and the third metal layer.

14. The device of claim 13, wherein the ferroelectric layer is Zr-doped HfO2, and a thickness of at least one buffer layer of the first and the second buffer layers is in a range of 5 nm to 50 nm, and a thickness of the dielectric layer is in a range of 5 nm to 50 nm.

15. The device of claim 13, wherein one or more of the devices are electrically connected to one or more resistors and one or more capacitors to form an analog matching circuit so as for impedance matching for an output of the circuit to an input of another circuit.

* * * * *